United States Patent
Jo et al.

(10) Patent No.: US 10,270,395 B2
(45) Date of Patent: Apr. 23, 2019

(54) ENVELOPE TRACKING CURRENT BIAS CIRCUIT WITH OFFSET REMOVAL FUNCTION AND POWER AMPLIFIER

(71) Applicant: Samsung Electro-Mechanics Co., Ltd., Suwon-si (KR)

(72) Inventors: Byeong Hak Jo, Suwon-si (KR); Jong Ok Ha, Suwon-si (KR); Jeong Hoon Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/875,463

(22) Filed: Jan. 19, 2018

(65) Prior Publication Data

US 2019/0028060 A1   Jan. 24, 2019

(30) Foreign Application Priority Data

Jul. 18, 2017 (KR) .................. 10-2017-0091091

(51) Int. Cl.
| | |
|---|---|
| H03F 1/02 | (2006.01) |
| H03F 1/56 | (2006.01) |
| H03F 3/21 | (2006.01) |
| H03F 3/24 | (2006.01) |
| H04B 1/04 | (2006.01) |

(52) U.S. Cl.
CPC ......... *H03F 1/0227* (2013.01); *H03F 1/0233* (2013.01); *H03F 1/56* (2013.01); *H03F 3/211* (2013.01); *H03F 3/245* (2013.01); *H04B 1/0475* (2013.01)

(58) Field of Classification Search
CPC ......... H03F 2200/102; H03F 2200/451; H03F 2200/381; H03F 3/45179; H03F 1/0227; H03F 1/0233; H03F 1/56; H03F 3/21; H03F 3/245; H04B 2001/0416; H02M 3/156; H03B 1/0475
See application file for complete search history.

(56) References Cited

U.S. PATENT DOCUMENTS

| | | | |
|---|---|---|---|
| 4,890,066 A | 12/1989 | Straver et al. | |
| 9,331,653 B2 | 5/2016 | Khesbak et al. | |
| 9,806,675 B2* | 10/2017 | Yang | H03F 3/193 |
| 2002/0031059 A1* | 3/2002 | Nishida | G11B 7/08541 369/44.28 |
| 2013/0043953 A1* | 2/2013 | Spiegel | H03F 1/0227 330/297 |
| 2014/0306763 A1* | 10/2014 | Hong | H03F 3/195 330/291 |

(Continued)

*Primary Examiner* — Khanh C Tran
(74) *Attorney, Agent, or Firm* — NSIP Law

(57) ABSTRACT

An envelope tracking (ET) current bias circuit comprises an envelope detection circuit detecting an ET voltage from an input signal; a first voltage/current converting circuit converting a reference voltage into a direct current (DC) current and adjusting the DC current according to a first control signal; a second voltage/current converting circuit converting the ET voltage into an ET current, adjusting the ET current according to a second control signal, and removing a DC offset current from the ET current to provide an offset compensated ET current; and an arithmetic circuit calculating levels of the offset compensated ET current and the DC current to generate an ET bias current.

17 Claims, 8 Drawing Sheets

(56) References Cited

U.S. PATENT DOCUMENTS

2015/0270806 A1* 9/2015 Wagh .................. H03F 3/211
                                                    330/296
2016/0072447 A1* 3/2016 Seth .................... H03F 1/0222
                                                    330/259

* cited by examiner

ENVELOPE TRACKING CURRENT BIAS CIRCUIT WITH OFFSET REMOVAL FUNCTION AND POWER AMPLIFIER

CROSS-REFERENCE TO RELATED APPLICATION

This application claims the benefit under 35 U.S.C. 119(a) of Korean Patent Application No. 10-2017-0091091, filed on Jul. 18, 2017 in the Korean Intellectual Property Office, the entire disclosure of which is incorporated herein by reference for all purposes.

BACKGROUND

1. Field

The following description relates to an envelope tracking (ET) current bias circuit and a power amplifier applied to a power amplification system to efficiently remove a direct current (DC) offset current from an ET current, based on an envelope of an input signal.

2. Description of Related Art

In general, average power tracking (APT) or envelope tracking (ET) are used as a method to reduce electric current consumption of a power amplifier module (PAM).

The APT technique is a method to increase efficiency by adjusting an electric source voltage (VCC) according to average output power. The ET technique is a method to increase efficiency by controlling the electric source voltage of a power amplifier (PA) according to an envelope of a radio frequency (RF) signal.

The ET technique is a method to reduce the average consumption of electric current by decreasing the electric source voltage of PA from a portion of the RF signals that have a relatively low level of amplitude, and to prevent the linearity thereof from being degraded by increasing the electric source voltage of PA in a portion of the RF signals that have a relatively high level of amplitude.

In addition, the APT technique is a method to provide VCC calculating an average value of an envelope signal for a predetermined period of time. Also, because the ET technique provides VCC calculating an instantaneous value of an envelope signal, ET modulators are separately required.

A power amplifier may include an ET bias circuit to reduce the consumption of electric current. ET bias circuits may include an envelope detection circuit and a voltage/current converting circuit to detect an envelope signal of an input signal.

However, because the envelope detection circuit provides an ET voltage, based on the envelope of the input signal, and the ET voltage includes an undesirable DC offset voltage, such DC offset voltage and the ET voltage are converted into an electric current in the voltage/current converting circuit. Therefore, there is a limitation in which an unnecessary DC offset current is included in the ET current output from the voltage/current converting circuit.

SUMMARY

This Summary is provided to introduce a selection of concepts that are further described below in the Detailed Description in simplified form. This Summary is not intended to identify key features or essential features of the claimed subject matter, nor is it intended to be used as an aid in determining the scope of the claimed subject matter.

Various examples provide an envelope tracking (ET) current bias circuit and a power amplifier configured to remove a direct current (DC) offset current from an ET current, based on an envelope of an input signal, thus, providing an accurate ET current.

In accordance with an example, there is provided an envelope tracking (ET) current bias circuit, including: an envelope detection circuit configured to detect an ET voltage from an input signal; a first voltage/current converting circuit configured to convert a reference voltage into a direct current (DC) current and adjust the DC current according to a first control signal; a second voltage/current converting circuit configured to convert the ET voltage into an ET current, adjust the ET current according to a second control signal, and remove a DC offset current from the ET current to provide an offset compensated ET current; and an arithmetic circuit configured to calculate levels of the offset compensated ET current and the DC current to generate an ET bias current.

The second voltage/current converting circuit may further include a circuit structure configured the same as a circuit structure of the first voltage/current converting circuit to generate a DC offset compensation current corresponding to a DC offset current included in the ET current and remove the DC offset current by using the DC offset compensation current.

The second voltage/current converting circuit may further include: a voltage/current converting circuit configured to provide the ET current adjusted according to the second control signal; an offset current generating circuit configured to generate a DC offset compensation current corresponding to a DC offset current included in the ET current and provide the DC offset compensation current adjusted according to the second control signal; and an offset removal circuit configured to remove the DC offset current included in the ET current by using the DC offset compensation current supplied from the offset current generating circuit.

The voltage/current converting circuit may further include: a first current source circuit configured to comprise a first operational amplifier, a first resistance circuit, and a first metal oxide semiconductor (MOS) transistor circuit to generate a first current according to the ET voltage; and a first current mirror circuit configured to comprise a second MOS transistor circuit connected to the first MOS transistor circuit by a current mirror to provide the ET current corresponding to the first current.

The offset current generating circuit may further include: a second current source circuit configured to comprise a second operational amplifier, a second resistance circuit, and a third MOS transistor circuit to generate the DC offset compensation current according to the reference voltage; a second current mirror circuit configured to comprise a fourth MOS transistor circuit connected to the third MOS transistor circuit by the current mirror to mirror the DC offset mirror current; and a third current mirror circuit configured to be connected to the second current mirror circuit by the current mirror and remove the DC offset current from the ET current by using the DC offset compensation current.

The first resistance circuit may be configured to adjust the ET current based on variations in a resistance value according to the second control signal, and the second resistance circuit may be configured to adjust the DC offset compensation current based on variations in the resistance value according to the second control signal.

The envelope detection circuit may further include: a rectifying circuit configured to detect the ET voltage from the input signal, wherein the ET voltage includes a DC offset voltage; an offset voltage generating circuit configured to generating a DC offset compensation voltage corresponding to the DC offset voltage; and an offset voltage cancellation circuit configured to subtract the DC offset compensation voltage from the DC offset voltage to provide the ET voltage from which the DC offset voltage may be reduced.

The arithmetic circuit may add or subtract the offset compensated ET current and the DC current IDC to generate the ET bias current.

In accordance with an example, there is provided a power amplifier, including: an ET current bias circuit configured to generate an ET bias current, based on an envelope of an input signal; and a power amplification circuit configured to comprise a buffered bias circuit amplifying the ET bias current to provide a second ET bias current and a power amplifier receiving the second ET bias current to amplify the input signal. The ET current bias circuit may further include: an envelope detection circuit configured to detect an ET voltage from the input signal; a first voltage/current converting circuit configured to convert a reference voltage into a DC current and adjust the DC current according to a first control signal; a second voltage/current converting circuit configured to convert the ET voltage into an ET current, adjust the ET current according to a second control signal, and remove a DC offset current from the ET current to provide an offset compensated ET current; and an arithmetic circuit configured to calculate levels of the offset compensated ET current and the DC current to generate the ET bias current.

The second voltage/current converting circuit may further include a circuit structure configured the same as a circuit structure of the first voltage/current converting circuit to generate a DC offset compensation current corresponding to the DC offset current included in the ET current and removes the DC offset current by using the DC offset compensation current.

The second voltage/current converting circuit may further include: a voltage/current converting circuit configured to provide the ET current adjusted according to the second control signal; an offset current generating circuit configured to generate a DC offset compensation current corresponding to the DC offset current included in the ET current and provide the DC offset compensation current adjusted according to the second control signal; and an offset removal circuit configured to remove the DC offset current included in the ET current by using the DC offset compensation current supplied from the offset current generating circuit.

The voltage/current converting circuit may further include: a first current source circuit configured to comprise a first operational amplifier, a first resistance circuit, and a first MOS transistor circuit to generate a first current according to the ET voltage; and a first current mirror circuit configured to comprise a second MOS transistor circuit connected to the first MOS transistor circuit by a current mirror to provide the envelope current corresponding to the first current.

The offset current generating circuit may further include: a second current source circuit configured to comprise a second operational amplifier, a second resistance circuit, and a third MOS transistor circuit to generate the DC offset compensation current according to the reference voltage; a second current mirror circuit configured to comprise a fourth MOS transistor circuit connected to the third MOS transistor circuit by the current mirror to mirror the DC offset compensation current; and a third current mirror circuit configured to be connected to the second current mirror circuit by the current mirror and remove the DC offset current from the ET current by using the DC offset compensation current.

The first resistance circuit may be configured to adjust the ET current based on variations in a resistance value according to the second control signal, and the second resistance circuit may be configured to adjust the DC offset compensation current based on variations in the resistance value according to the second control signal.

The envelope detection circuit may further include: a rectifying circuit configured to detect the ET voltage from the input signal, wherein the ET voltage includes a DC offset voltage; an offset voltage generating circuit configured to generate a DC offset compensation voltage corresponding to the DC offset voltage; and an offset voltage cancellation circuit configured to subtract the DC offset compensation voltage from the DC offset voltage to provide the ET voltage from which the DC offset voltage may be reduced.

The power amplification circuit may be further configured to receive an electric source voltage, wherein the electric source voltage may be based on an envelope of the input signal or independent from the envelope of the input signal.

The aritmetic circuit adds or subtracts the offset compensated ET current and the DC current addition based on one or more of a frequency band, a band width, a power mode, and a magnitude of output power of the power amplification circuit.

Other features and aspects will be apparent from the following detailed description, the drawings, and the claims.

Figure 1:
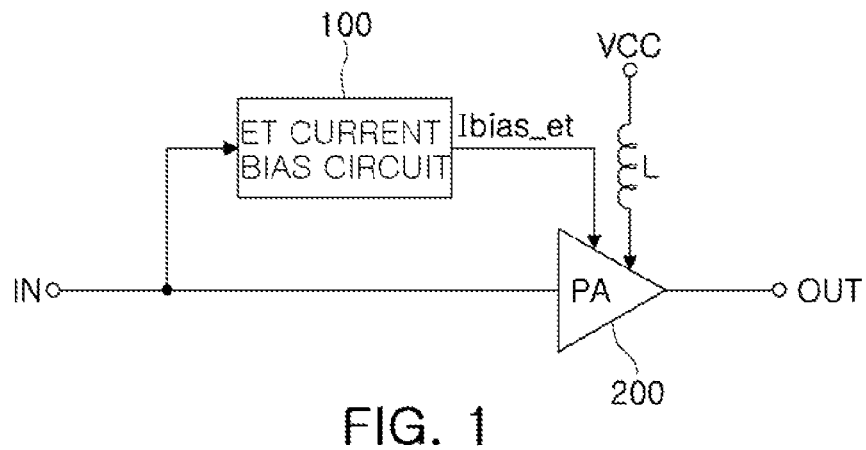
FIG. 1 is a view of a power amplifier, according to an example.

Throughout the drawings and the detailed description, the same reference numerals refer to the same elements. The drawings may not be to scale, and the relative sizes, proportions, and depictions of elements in the drawings may be exaggerated for the purpose of clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a view of a power amplifier, according to an example.

With reference to FIG. 1, a power amplifier includes an envelope tracking (ET) current bias circuit 100 and a power amplification circuit 200.

The ET current bias circuit 100 generates an ET bias current Ibias_et, based on an envelope of an input signal Sin input through an input terminal IN, shared between the ET current bias circuit 100 and the power amplification circuit 200. The ET bias current Ibias_et is supplied to the power amplification circuit 200.

The power amplification circuit 200 receives the ET bias current Ibias_et and an electric source voltage VCC and amplifies the input signal Sin input through the input terminal IN to be output through an output terminal OUT.

Figure 2:
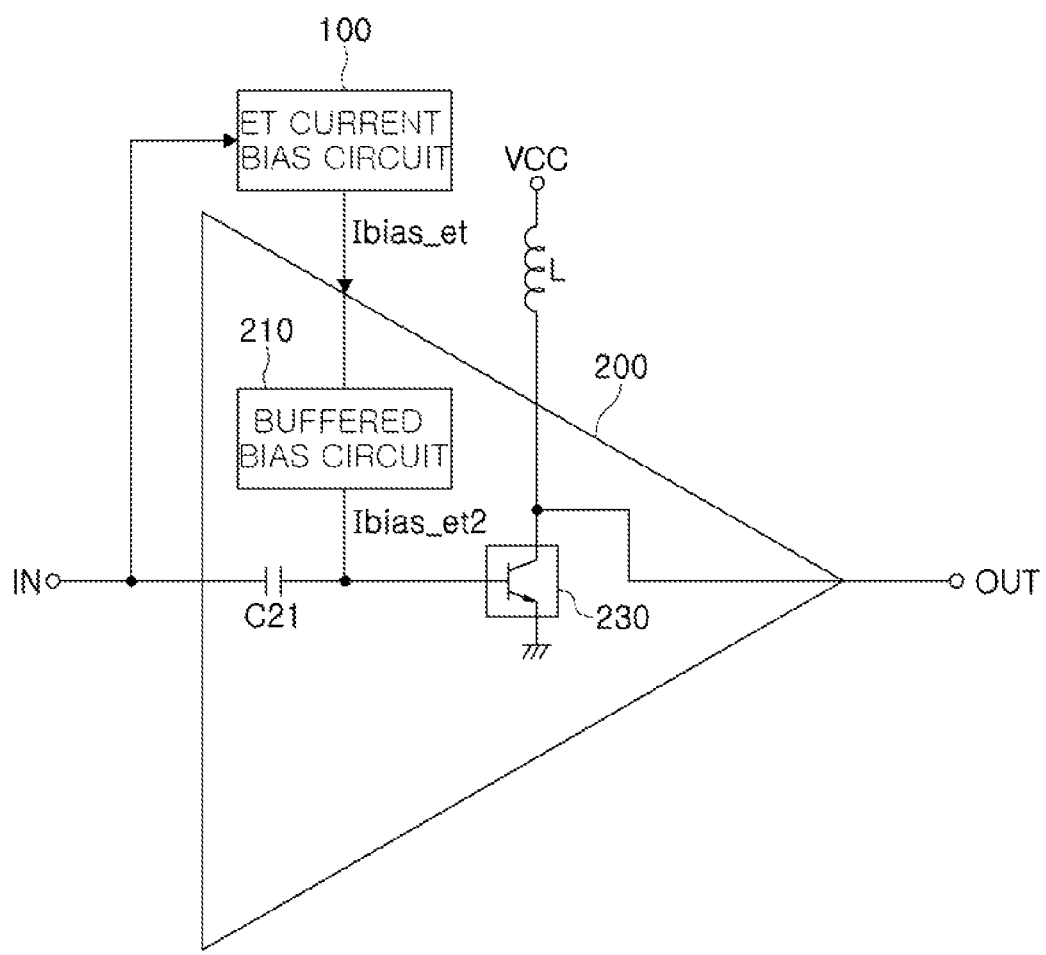
FIG. 2 is a view of a power amplifier, according to an example.

FIG. 2 is a view of a power amplifier, according to an example.

With reference to FIG. 2, the power amplifier includes the ET current bias circuit 100 and the power amplification circuit 200.

The ET current bias circuit 100 generates an ET bias current Ibias_et, based on an envelope of an input signal Sin. The input signal Sin is also supplied to the power amplification circuit. The ET bias current Ibias_et is supplied to the power amplification circuit 200.

The power amplification circuit 200 includes a buffered bias circuit 210 and a power amplifier (PA) 230.

The buffered bias circuit 210 amplifies the ET bias current Ibias_et and outputs a second ET bias current Ibias_et2 to the power amplifier (PA) 230. The power amplifier (PA) 230 receives the second ET bias current Ibias_et2 and the electric source voltage VCC and amplifies the input signal Sin input through an input terminal IN to be output through an output terminal (OUT).

In this example, the electric source voltage VCC is provided or supplied as a voltage, based on the envelope of the input signal Sin, or is provided or supplied as a voltage, not based on or independent from the envelope of the input signal Sin. In FIGS. 1 and 2, L is a coil to block or remove an alternating current (AC) current from the electric source voltage VCC. In FIG. 2, C21 is a capacitor to block or remove a DC current from the input signal Sin.

In terms of components having the same reference symbol and the same function in embodiments of respective drawings, unnecessary overlapping descriptions thereof may be omitted, while differences between embodiments of respective drawings may be described.

Figure 3:
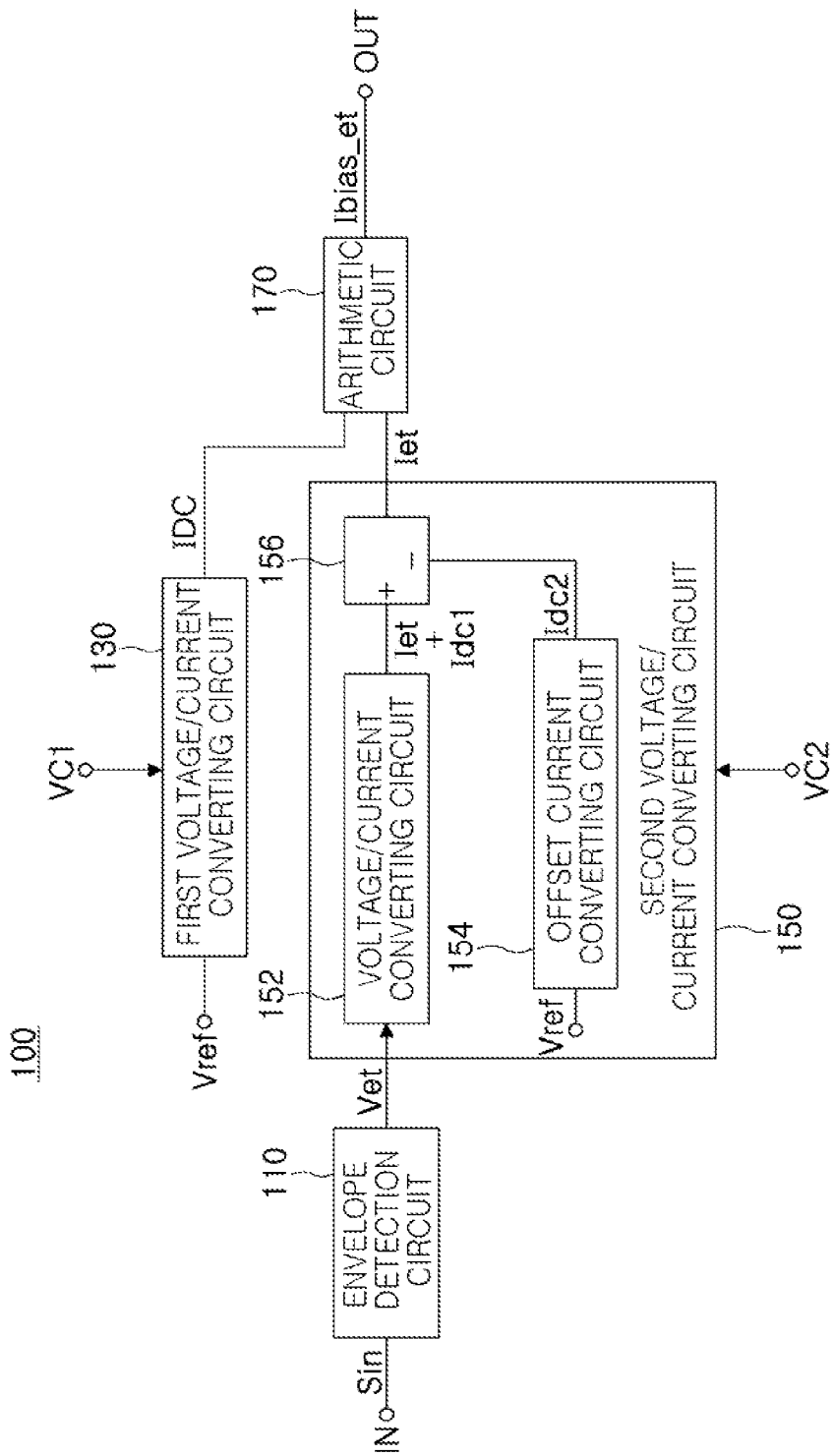
FIG. 3 is a view of an envelope tracking (ET) current bias circuit, according to an example.

FIG. 3 is a view of an ET current bias circuit, according to an example.

With reference to FIG. 3, an ET current bias circuit 100 includes an envelope detection circuit 110, a first voltage/current converting circuit 130, a second voltage/current converting circuit 150, and an arithmetic circuit 170.

The envelope detection circuit 110 detects an ET voltage Vet from an input signal Sin.

The first voltage/current converting circuit 130 converts a reference voltage Vref into a DC current IDC and adjusts the DC current IDC according to a first control signal VC1. In one example, the reference voltage Vref is a predetermined voltage.

The second voltage/current converting circuit 150 converts the ET voltage Vet into an ET current Iet, adjusts the ET current Iet according to the second control signal VC2, and removes a DC offset current Idc1 from the ET current Iet to provide an offset compensated ET current Iet_comp. In other words, the DC current IDC is adjusted according to the first control signal VC1, and the ET current Iet is adjusted according to the second control signal VC2. Thus, the ET current bias circuit 100 uses the first control signal VC1 and the second control signal VC2 to adjust a ratio of the DC current IDC to the ET current Iet included in the ET bias current Ibias_et.

The arithmetic circuit 170 calculates levels of the offset compensated ET current Iet_comp and the DC current IDC to generate the ET bias current Ibias_et.

In an example, the arithmetic circuit 170 adds or subtracts the offset compensated ET current Iet_comp and the DC current IDC to generate the ET bias current Ibias_et. In this example, addition or subtraction described above is selected according to operating characteristics of a power amplification circuit. The operating characteristics of the power amplification circuit is determined by at least one of a frequency band, a band width, a power mode, and a magnitude of output power.

In addition, values of the first control signal VC1 and the second control signal VC2 are determined according to the operating characteristics of the power amplification circuit.

In an example, the second voltage/current converting circuit 150 includes a circuit structure the same as that of the first voltage/current converting circuit 130 to generate a DC offset compensation current Idc2 corresponding to a DC offset current Idc1 included in the ET current Iet and uses or processes the DC offset compensation current Idc2 to remove the DC offset current Idc1.

In an example, the DC offset compensation current Idc2 is equal to the DC offset current Idc1. In this example, the DC offset current Idc1 is entirely removed by the DC offset compensation current Idc2. In an alternative example, the DC offset current Idc1 is partially removed by the DC offset compensation current Idc2.

For example, the second voltage/current converting circuit 150 includes a voltage/current converting circuit 152, an offset current generating circuit 154, and an offset removal circuit 156.

The voltage/current converting circuit 152 converts the ET voltage Vet into the ET current Iet and provides or outputs the ET current Iet adjusted according to the second control signal VC2.

The offset current generating circuit 154 generates the DC offset compensation current Idc2 corresponding to the DC offset current Idc1 included in the ET current Iet and provides the DC offset compensation current Idc2 adjusted according to the second control signal VC2.

The offset removal circuit 156 uses the DC offset compensation current Idc2 from the offset current generating circuit 154 to remove the DC offset current Idc1 in the ET current Iet from the voltage/current converting circuit 152.

Figure 4:
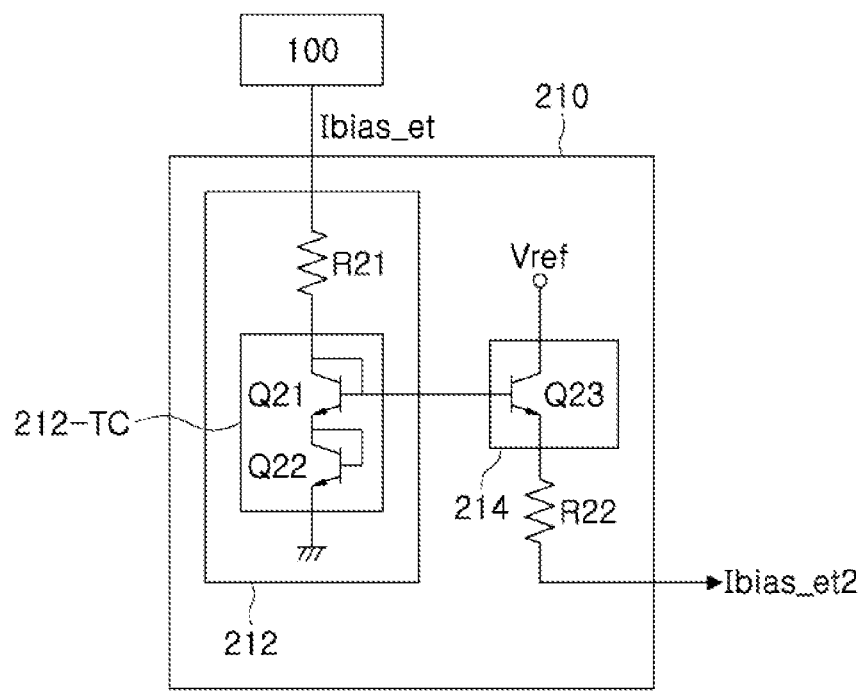
FIG. 4 is a view of a buffered bias circuit, according to an example.

FIG. 4 is a view of a buffered bias circuit, according to an example.

A buffered bias circuit 210 uses an ET bias current Ibias-et to generate a second ET bias current Ibias_et2 and supplies the second ET bias current Ibias_et2 to a base of a power amplifier 230.

In an example in which the buffered bias circuit 210 has a current gain of at least 100 times, the ET bias current Ibias-et on the microampere ($\mu$A) level is amplified to be the second ET bias current Ibias-et2 on the milliampere (mA) level.

In an example, the buffered bias circuit 210 includes a current bias circuit 212 and a current amplifier 214.

The current bias circuit 212 is connected between an output terminal of an ET current bias circuit 100 and a ground. The current bias circuit 212 includes a first bias resistance circuit R21 and a temperature compensation circuit 212-TC. In this example, the temperature compensation circuit 212-TC is replaced with a bias resistor in response to a temperature compensation function being unnecessary.

The first bias resistance circuit R21 is connected between the output terminal of the ET current bias circuit 100 and a base of a current amplifier 214. In an example, the first bias resistance circuit R21 includes at least one resistor R21.

In order to perform temperature compensation, the temperature compensation circuit 212-TC includes at least two diode-connected transistors Q21 and Q22, connected between the base of the current amplifier 214 and the ground and has a resistance value that varies according to a temperature. In this case, a voltage applied to the temperature compensation circuit 212-TC is determined according to resistance values of the first bias resistance circuit R21 and of the temperature compensation circuit 212-TC, and a bias current is determined according to the voltage. Because the diode-connected transistors Q21 and Q22 have a resistance value according to or as a function of a temperature, the diode-connected transistors Q21 and Q22 perform, conduct, or execute the temperature compensation.

The current amplifier 214 is current biased by the current bias circuit 212 to amplify the ET bias current Ibias-et to generate the second ET bias current Ibias-et2. In an example, the current amplifier 214 includes a BJT transistor Q23 having a collector receiving a reference voltage Vref, an emitter connected to the ground, and a base connected to the current bias circuit 212.

In this example, the collector of the BJT transistor Q23 receives an electric source voltage VCC through a coil L. A base of the BJT transistor Q23 receives the input signal Sin through a capacitor (C21 of FIG. 2) connected to the input terminal IN.

In addition, the buffered bias circuit 210 includes a ballast resistor R22. The ballast resistor R22 is a resistor to prevent thermal runaway in an output terminal outputting the second ET bias current Ibias_et2.

The ballast resistor R22 is connected to the output terminal outputting the second ET bias current Ibias_et2, so that a base-emitter voltage of a bipolar junction transistor (BJT) Q23 is adjusted according to a resistance value of the ballast resistor R220. Accordingly, in a case in which a resistance value of the ballast resistor R22 is appropriately set, an amplitude modulation-phase modulation (AM-PM) distortion of the power amplification circuit 100 is reduced.

The ballast resistor R22 has a predetermined resistance value to reduce the amplitude modulation-phase modulation (AM-PM) distortion in a frequency band of the input signal.

Furthermore, in an example in which output power of a power amplification circuit should be relatively increased, the buffered bias circuit 210 excludes the ballast resistor R22.

Figure 5:
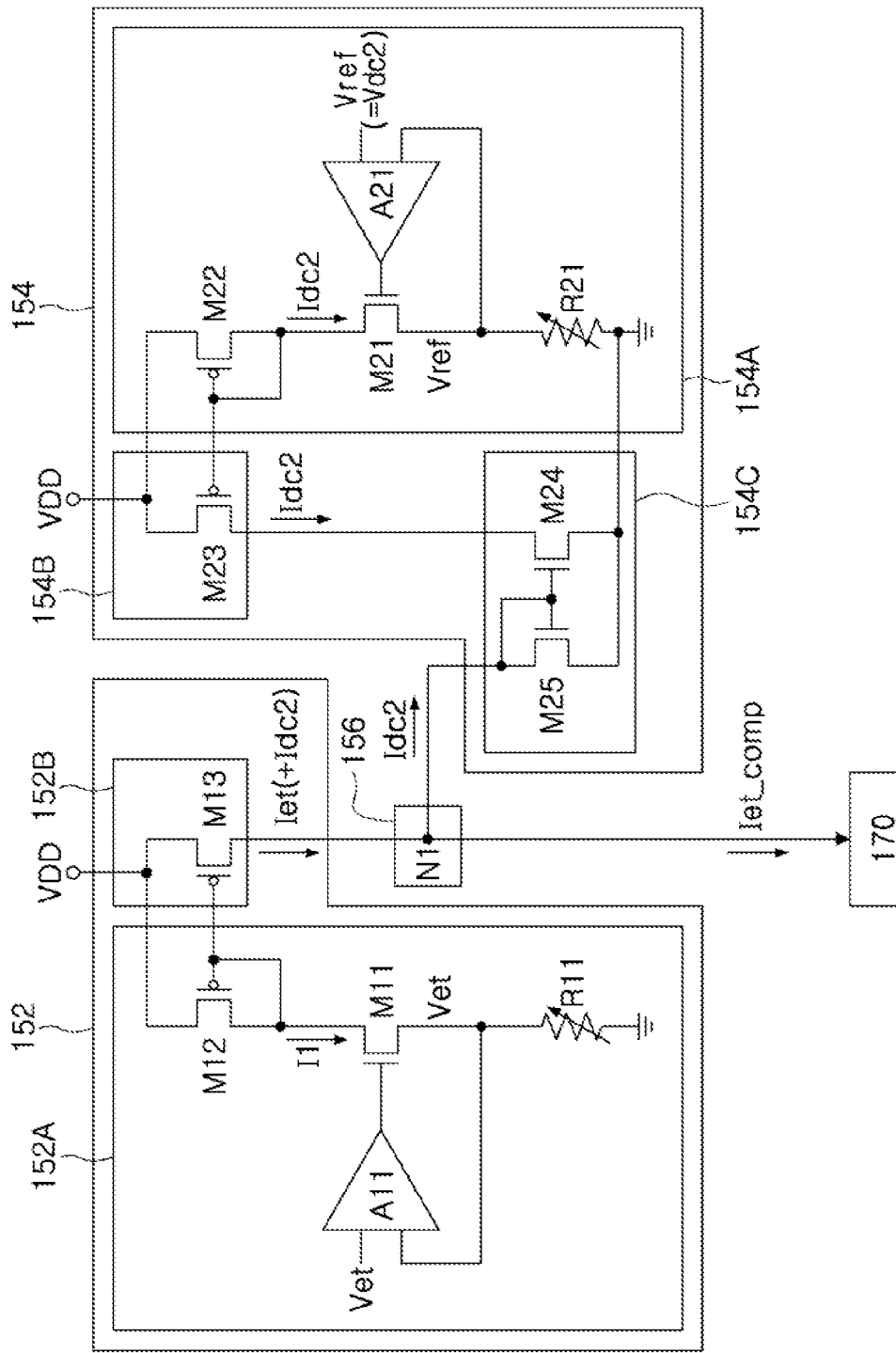
FIG. 5 is a view of a second voltage/current converting circuit, according to an example.
Figure 6:
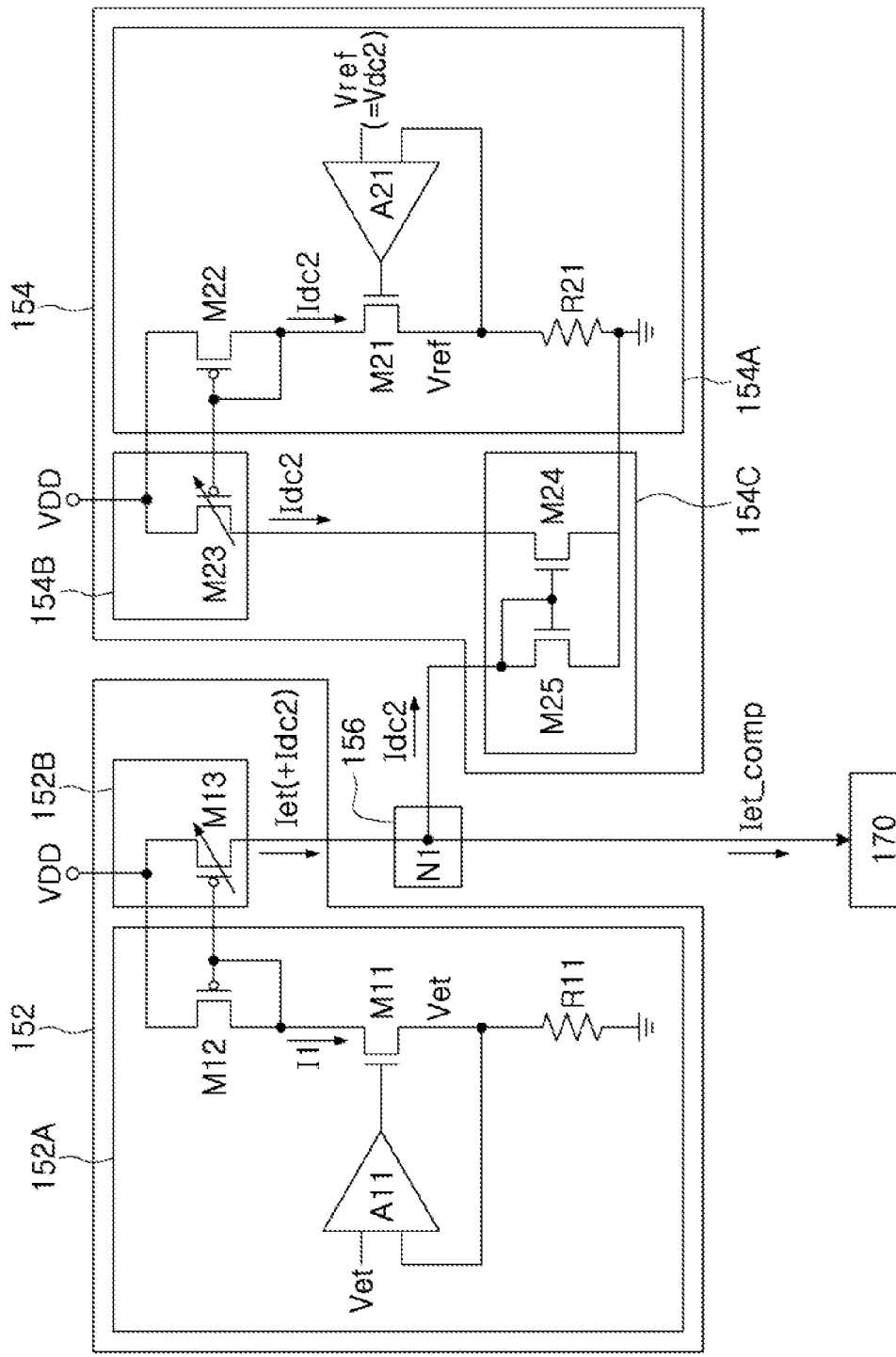
FIG. 6 is another view of a second voltage/current converting circuit, according to an example.

FIG. 5 is an example of a second voltage/current converting circuit. FIG. 6 is another example of the second voltage/current converting circuit.

With reference to FIGS. 5 and 6, a voltage/current converting circuit 152 includes a first current source circuit 152A and a first current mirror circuit 152B.

The first current source circuit 152A includes a first operational amplifier A11, a first resistance circuit R11, and first metal oxide semiconductor (MOS) transistor circuits M11 and M12 between an electric source voltage VDD terminal and a ground to generate a first current I1 according to an ET voltage Vet. In an example, the first resistance circuit R11 includes at least one resistor R11.

The first current mirror circuit 152B includes a second MOS transistor circuit M13 connected to the first MOS transistor circuits M11 and M12 by a current mirror to provide the ET current Iet corresponding to the first current I1.

An offset current generating circuit 154 includes a second current source circuit 154A, a second current mirror circuit 154B, and a third current mirror circuit 154C.

The second current source circuit 154A includes a second operational amplifier A21, a second resistance circuit R21, and third MOS transistor circuits M21 and M22 between the electric source voltage VDD terminal and the ground to generate a DC offset compensation current Idc2 according to a reference voltage Vref. In an example, the second resistance circuit R21 includes at least one resistor R21.

The second current mirror circuit 154B includes a fourth MOS transistor circuit M23 connected to the third MOS transistor circuits M21 and M22 by the current mirror to mirror the DC offset compensation current Idc2.

The third current mirror circuit 154C is connected to the second current mirror circuit 154B by the current mirror and removes the DC offset current Idc1 from the ET current Iet by using the DC offset compensation current Idc2.

For example, with reference to FIGS. 5 and 6, an offset removal circuit 156 includes a connection node N1 connected to an output terminal of the voltage/current converting circuit 152 and an output terminal of the offset current generating circuit 154. In the connection node N1, the DC offset current Idc1 included in the ET current Iet is supplied to the ground with a magnitude equal to that of the DC offset compensation current Idc2 through the offset current generating circuit 154 to be removed. In an example in which the DC offset current Idc1 is set to be equal to the DC offset compensation current Idc2, an entirety of the DC offset current Idc1 is removed.

In FIGS. 5 and 6, the ET bias current Iet and an offset compensated ET current Iet_comp may be determined as the following Equation 1.

$$Iet = Vet/R11 = \quad\quad\quad\quad\quad\quad\quad\quad\text{[Equation 1]}$$
$$(Venv + Vdc1)/R11 = Venv/R11 + Vdc1/R11$$
$$Iet_{comp} = Iet - Idc2 = (Venv/R11 + Vdc1/R11) -$$
$$Vdc2/R21 = Venv/R11 + Vdc1 * A(에기사),$$
$$Vdc1 = Vdc2, A = 1/R11 - 1/R21)$$

In Equation 1, R11 is a resistance value of the first resistance circuit R11, and R21 is a resistance value of the second resistance circuit R21.

With reference to Equation 1, in an example in which R11 and R21 vary in the same ratio, A is a constant value, and the offset compensated ET current Iet_comp is adjusted by using R11.

With reference to FIG. 5, the first resistance circuit R11 adjusts the ET current Iet based on variations in a resistance value according to the second control signal VC2. The second resistance circuit R21 adjusts the DC offset compensation current Idc2 based on variations in the resistance value according to the second control signal VC2.

In an example, each of the first resistance circuit R11 and the second resistance circuit R21 includes a plurality of switches and a plurality of resistors, which are selected by the corresponding plurality of switches, and connected in parallel. The plurality of switches are operated according to the second control signal VC2 to select at least one of the plurality of resistors.

With reference to FIG. 6, the second MOS transistor circuit M13 adjusts the ET current Iet according to the second control signal VC2. The fourth MOS transistor circuit M23 adjusts the DC offset compensation current Idc2 according to the second control signal VC2.

In an example, each of the second MOS transistor circuit M13 and the fourth MOS transistor circuit M23 include the plurality of switches and a plurality of MOS transistors, which are correspondingly selected by each of the plurality of switches, and connected to the third MOS transistor circuits M21 and M22 in parallel by the current mirror. The plurality of switches are operated according to the second control signal VC2 to select at least one of the plurality of MOS transistors.

Figure 7:
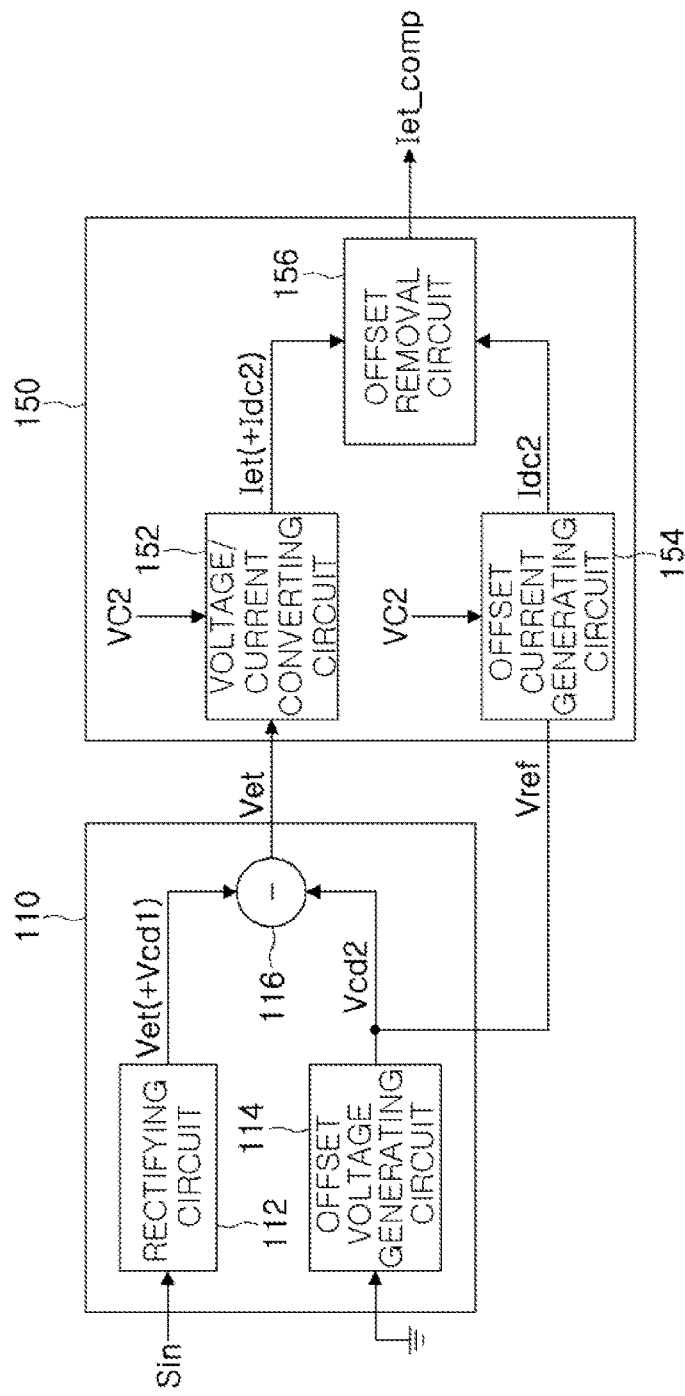
FIG. 7 is another view of an ET current bias circuit, according to an example.

FIG. 7 is another view of an ET current bias circuit, according to an example.

With reference to FIG. 7, an envelope detection circuit 110 includes a rectifying circuit 112, an offset voltage generating circuit 114, and an offset voltage cancellation circuit 116.

The rectifying circuit 112 detects an ET voltage Vet from an input signal Sin, while the ET voltage Vet includes a DC offset voltage Vdc1.

The offset voltage generating circuit 114 generates a DC offset compensation voltage Vdc2 corresponding to the DC offset voltage Vdc1.

The offset voltage cancellation circuit 116 subtracts the DC offset compensation voltage Vdc2 from the DC offset voltage Vdc1 to provide the ET voltage Vet from which the DC offset voltage Vdc is reduced.

In an example, the offset voltage generating circuit 114 has a circuit structure the same as that of the rectifying circuit 112 to generate a DC offset compensation voltage corresponding to the DC offset voltage Vdc1 of the rectifying circuit 112.

In this example, the DC offset voltage Vdc1 included in the ET voltage Vet is reduced by the DC offset compensation voltage Vdc2, but may not be completely removed to drive a circuit on a rear end (e.g., 116 of FIG. 7).

Figure 8:
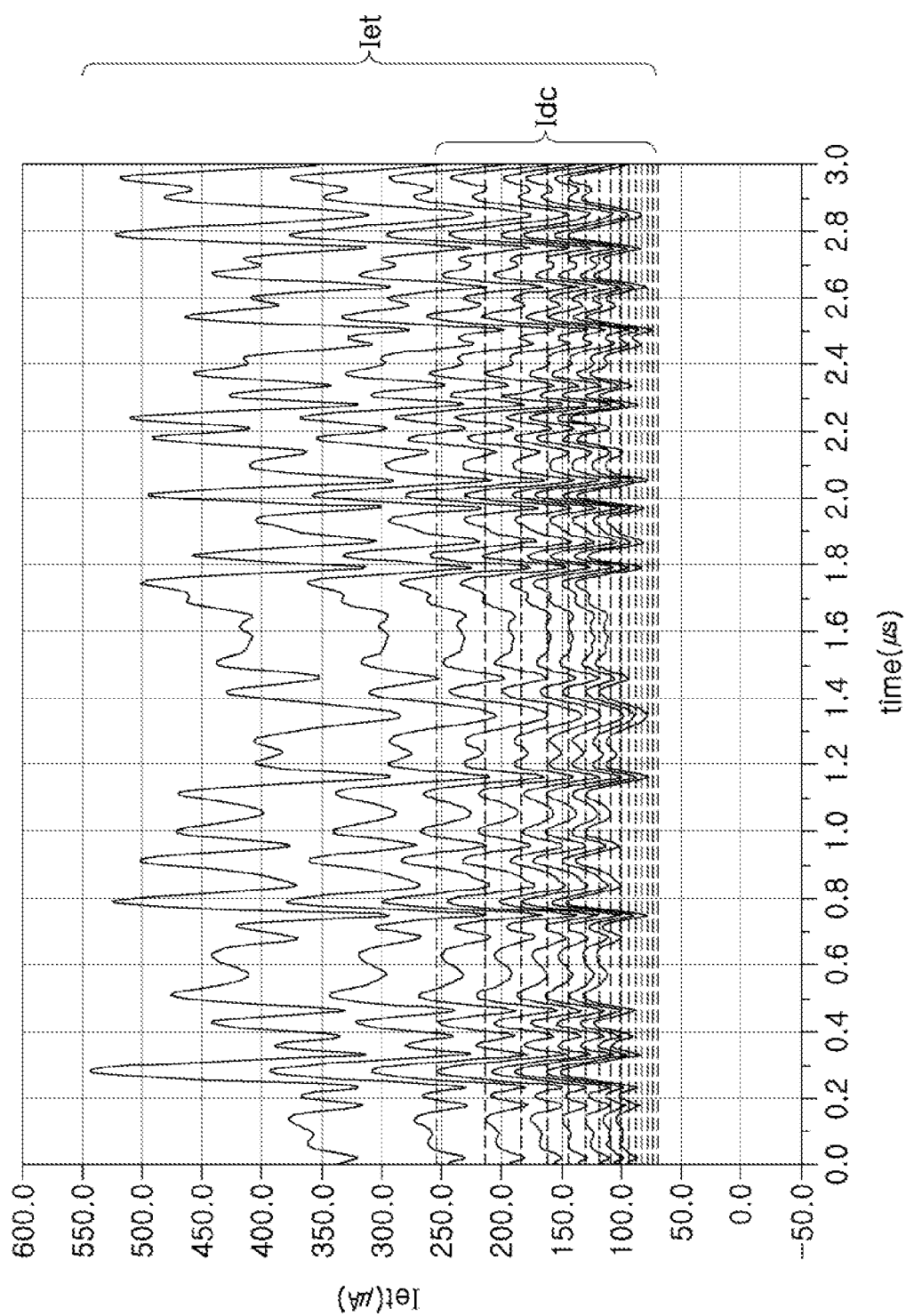
FIG. 8 is a waveform diagram of an envelope current.

FIG. 8 is a waveform diagram of an envelope current.

With reference to FIG. 8, it can be confirmed that an ET current may include an ET current Iet and a DC offset current Idc1.

Thus, it can be confirmed that, a magnitude of the DC offset current Idc1 is increased, as a magnitude of the ET current is increased according to amplification.

Figure 9:
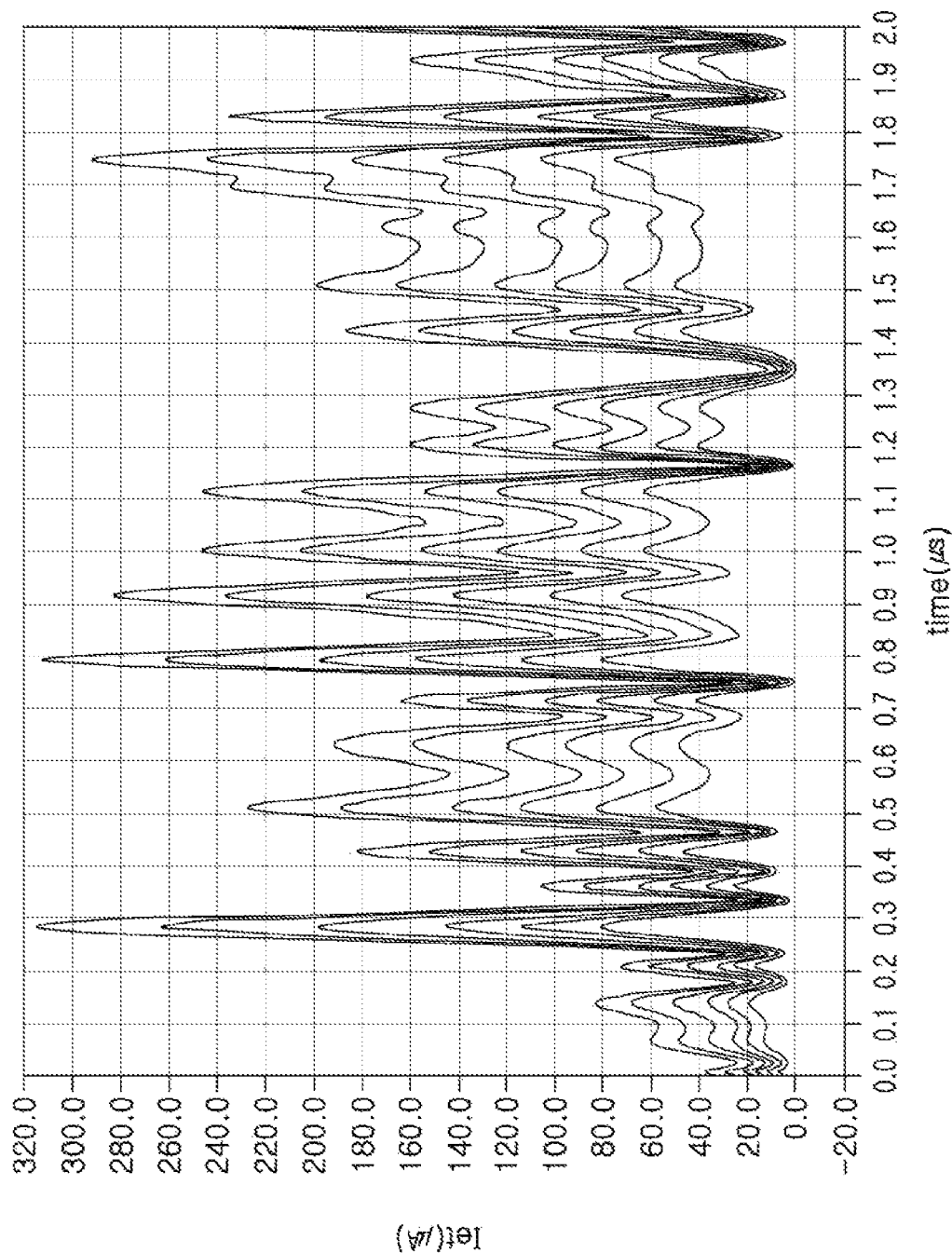
FIG. 9 is a waveform diagram of an envelope current, according to an example.

FIG. 9 is a waveform diagram of an envelope current, according to an example.

With reference to FIG. 9, the envelope current includes only an ET current Iet after a DC offset current is removed, according to descriptions above.

As set forth above, according to embodiments, a DC offset current of an ET current bias circuit is efficiently removed to accurately detect an envelope from an input signal, providing an ET bias current having improved the DC offset current, and improving performance of a power amplifier.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An envelope tracking (ET) current bias circuit, comprising:
   an envelope detection circuit configured to detect an ET voltage from an input signal;
   a first voltage/current converting circuit configured to convert a reference voltage into a direct current (DC) current and adjust the DC current according to a first control signal;
   a second voltage/current converting circuit configured to convert the ET voltage into an ET current, adjust the ET current according to a second control signal, and remove a DC offset current from the ET current to provide an offset compensated ET current; and
   an arithmetic circuit configured to calculate levels of the offset compensated ET current and the DC current to generate an ET bias current.

2. The ET current bias circuit of claim 1, wherein the second voltage/current converting circuit comprises a circuit structure configured the same as a circuit structure of the first voltage/current converting circuit to generate a DC offset compensation current corresponding to a DC offset current included in the ET current and remove the DC offset current by using the DC offset compensation current.

3. The ET current bias circuit of claim 1, wherein the second voltage/current converting circuit comprises:
   a voltage/current converting circuit configured to provide the ET current adjusted according to the second control signal;
   an offset current generating circuit configured to generate a DC offset compensation current corresponding to a DC offset current included in the ET current and provide the DC offset compensation current adjusted according to the second control signal; and
   an offset removal circuit configured to remove the DC offset current included in the ET current by using the DC offset compensation current supplied from the offset current generating circuit.

4. The ET current bias circuit of claim 3, wherein the voltage/current converting circuit comprises:
   a first current source circuit configured to comprise a first operational amplifier, a first resistance circuit, and a first metal oxide semiconductor (MOS) transistor circuit to generate a first current according to the ET voltage; and
   a first current mirror circuit configured to comprise a second MOS transistor circuit connected to the first MOS transistor circuit by a current mirror to provide the ET current corresponding to the first current.

5. The ET current bias circuit of claim 4, wherein the offset current generating circuit comprises:
   a second current source circuit configured to comprise a second operational amplifier, a second resistance circuit, and a third MOS transistor circuit to generate the DC offset compensation current according to the reference voltage;
   a second current mirror circuit configured to comprise a fourth MOS transistor circuit connected to the third MOS transistor circuit by the current mirror to mirror the DC offset mirror current; and
   a third current mirror circuit configured to be connected to the second current mirror circuit by the current mirror and remove the DC offset current from the ET current by using the DC offset compensation current.

6. The ET current bias circuit of claim 5, wherein the first resistance circuit is configured to adjust the ET current based on variations in a resistance value according to the second control signal, and the second resistance circuit is configured to adjust the DC offset compensation current based on variations in the resistance value according to the second control signal.

7. The ET current bias circuit of claim 1, wherein the envelope detection circuit comprises:
   a rectifying circuit configured to detect the ET voltage from the input signal, wherein the ET voltage includes a DC offset voltage;
   an offset voltage generating circuit configured to generating a DC offset compensation voltage corresponding to the DC offset voltage; and
   an offset voltage cancellation circuit configured to subtract the DC offset compensation voltage from the DC offset voltage to provide the ET voltage from which the DC offset voltage is reduced.

8. The ET current bias circuit of claim 1, wherein the arithmetic circuit adds or subtracts the offset compensated ET current and the DC current to generate the ET bias current.

9. A power amplifier, comprising:
   an envelope tracking (ET) current bias circuit configured to generate an ET bias current, based on an envelope of an input signal; and
   a power amplification circuit configured to comprise a buffered bias circuit amplifying the ET bias current to provide a second ET bias current and a power amplifier receiving the second ET bias current to amplify the input signal,
   wherein the ET current bias circuit comprises:
   an envelope detection circuit configured to detect an ET voltage from the input signal;
   a first voltage/current converting circuit configured to convert a reference voltage into a DC current and adjust the DC current according to a first control signal;
   a second voltage/current converting circuit configured to convert the ET voltage into an ET current, adjust the ET current according to a second control signal, and remove a DC offset current from the ET current to provide an offset compensated ET current; and
   an arithmetic circuit configured to calculate levels of the offset compensated ET current and the DC current to generate the ET bias current.

10. The power amplifier of claim 9, wherein the second voltage/current converting circuit comprises a circuit structure configured the same as a circuit structure of the first voltage/current converting circuit to generate a DC offset compensation current corresponding to the DC offset current included in the ET current and removes the DC offset current by using the DC offset compensation current.

11. The power amplifier of claim 9, wherein the second voltage/current converting circuit comprises:
   a voltage/current converting circuit configured to provide the ET current adjusted according to the second control signal;
   an offset current generating circuit configured to generate a DC offset compensation current corresponding to the DC offset current included in the ET current and provide the DC offset compensation current adjusted according to the second control signal; and
   an offset removal circuit configured to remove the DC offset current included in the ET current by using the DC offset compensation current supplied from the offset current generating circuit.

12. The power amplifier of claim 11, wherein the voltage/current converting circuit comprises:
   a first current source circuit configured to comprise a first operational amplifier, a first resistance circuit, and a first metal oxide semiconductor (MOS) transistor circuit to generate a first current according to the ET voltage; and
   a first current mirror circuit configured to comprise a second MOS transistor circuit connected to the first MOS transistor circuit by a current mirror to provide the ET current corresponding to the first current.

13. The power amplifier of claim 12, wherein the offset current generating circuit comprises:
   a second current source circuit configured to comprise a second operational amplifier, a second resistance circuit, and a third MOS transistor circuit to generate the DC offset compensation current according to the reference voltage;
   a second current mirror circuit configured to comprise a fourth MOS transistor circuit connected to the third MOS transistor circuit by the current mirror to mirror the DC offset compensation current; and
   a third current mirror circuit configured to be connected to the second current mirror circuit by the current mirror and remove the DC offset current from the ET current by using the DC offset compensation current.

14. The power amplifier of claim 13, wherein the first resistance circuit is configured to adjust the ET current based on variations in a resistance value according to the second control signal, and the second resistance circuit is configured to adjust the DC offset compensation current based on variations in the resistance value according to the second control signal.

15. The power amplifier of claim 9, wherein the envelope detection circuit comprises:
   a rectifying circuit configured to detect the ET voltage from the input signal, wherein the ET voltage includes a DC offset voltage;
   an offset voltage generating circuit configured to generate a DC offset compensation voltage corresponding to the DC offset voltage; and
   an offset voltage cancellation circuit configured to subtract the DC offset compensation voltage from the DC offset voltage to provide the ET voltage from which the DC offset voltage is reduced.

16. The power amplifier of claim 9, wherein the power amplification circuit is further configured to receive an electric source voltage, wherein the electric source voltage is based on an envelope of the input signal or independent from the envelope of the input signal.

17. The power amplifier of claim 9, wherein the arithmetic circuit adds or subtracts the offset compensated ET current and the DC current based on one or more of a frequency band, a band width, a power mode, and a magnitude of output power of the power amplification circuit.

* * * * *